(12) United States Patent
Usui et al.

(10) Patent No.: US 10,613,632 B2
(45) Date of Patent: Apr. 7, 2020

(54) ELECTRIC MACHINE CONVERTING ELEMENT AND TACTILE SENSE PRESENTING DEVICE

(71) Applicant: Murata Manufacturing Co., Ltd., Nagaokakyo-shi, Kyoto-fu (JP)

(72) Inventors: Kentaro Usui, Nagaokakyo (JP); Junichi Hashimoto, Nagaokakyo (JP); Kentaro Mikawa, Nagaokakyo (JP); Nobuhito Tsubaki, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 41 days.

(21) Appl. No.: 15/432,122

(22) Filed: Feb. 14, 2017

(65) Prior Publication Data
US 2017/0153706 A1    Jun. 1, 2017

Related U.S. Application Data

(63) Continuation of application No. PCT/JP2015/072599, filed on Aug. 10, 2015.

(30) Foreign Application Priority Data

Aug. 21, 2014  (JP) ................... 2014-168071

(51) Int. Cl.
*G06F 3/01*    (2006.01)
*H01L 41/193*    (2006.01)
(Continued)

(52) U.S. Cl.
CPC ............... *G06F 3/016* (2013.01); *B06B 1/06* (2013.01); *B06B 1/0611* (2013.01); *G06F 3/01* (2013.01);
(Continued)

(58) Field of Classification Search
CPC ......... B06B 1/06; B06B 1/0611; G06F 3/016; G06F 3/01; G06F 3/041; H01L 41/083;
(Continued)

(56) References Cited

U.S. PATENT DOCUMENTS

| | | | |
|---|---|---|---|
| 6,218,769 B1 * | 4/2001 | Iino | H01L 41/0913 310/323.02 |
| 6,677,034 B1 * | 1/2004 | Hooley | B06B 1/0603 102/303 |
| 2002/0050769 A1 * | 5/2002 | Pelrine | F04B 35/00 310/363 |

FOREIGN PATENT DOCUMENTS

| | | |
|---|---|---|
| JP | S59-115580 A | 7/1984 |
| JP | 2012-198582 A | 10/2012 |
| JP | 2014-014266 A | 1/2014 |

OTHER PUBLICATIONS

International Search Report issued for PCT/JP2015/072599, dated Oct. 27, 2015.
(Continued)

*Primary Examiner* — Alexander Eisen
*Assistant Examiner* — Cory A Almeida
(74) *Attorney, Agent, or Firm* — Arent Fox LLP

(57) ABSTRACT

A piezoelectric element that includes a plurality of laminated piezoelectric films and adhesive layers. The piezoelectric films stretch and contract in a predetermined direction parallel to principal surfaces thereof when a voltage is applied thereto. The adhesive layers are formed partially between the piezoelectric films when seen from a plan view, are aligned at intervals in the predetermined direction of the stretching and contracting of the piezoelectric films and bond the piezoelectric films to each other. The adhesive layers are formed at both ends of the piezoelectric films in the predetermined direction.

13 Claims, 3 Drawing Sheets

(51) Int. Cl.
  *G06F 3/041*    (2006.01)
  *H01L 41/083*   (2006.01)
  *B06B 1/06*     (2006.01)
  *H01L 41/09*    (2006.01)
  *H02N 2/00*     (2006.01)

(52) U.S. Cl.
  CPC ............ *G06F 3/041* (2013.01); *H01L 41/083* (2013.01); *H01L 41/09* (2013.01); *H01L 41/0986* (2013.01); *H01L 41/193* (2013.01); *H02N 2/001* (2013.01)

(58) Field of Classification Search
  CPC ... H01L 41/09; H01L 41/0986; H01L 41/193; H02N 2/001
  See application file for complete search history.

(56) References Cited

OTHER PUBLICATIONS

Written Opinion of the International Searching Authority issued for International Application No. PCT/JP2015/072599, dated Oct. 27, 2015.

* cited by examiner

STRETCHING AND CONTRACTING DIRECTION

STRETCHING AND
CONTRACTING DIRECTION

STRETCHING AND
CONTRACTING DIRECTION

ELECTRIC MACHINE CONVERTING ELEMENT AND TACTILE SENSE PRESENTING DEVICE

CROSS REFERENCE TO RELATED APPLICATIONS

The present application is a continuation of International application No. PCT/JP2015/072599, filed Aug. 10, 2015, which claims priority to Japanese Patent Application No. 2014-168071, filed Aug. 21, 2014, the entire contents of each of which are incorporated herein by reference.

FIELD OF THE INVENTION

The present invention relates to an electric machine converting element which is formed by laminating films which stretch and contract when a voltage is applied, and a tactile sense presenting device which includes the electric machine converting element.

BACKGROUND OF THE INVENTION

Patent Document 1 discloses a piezoelectric element as a conventional electric machine converting element, for example. This piezoelectric element is formed by laminating piezoelectric films sandwiched by electrodes, and bonding the piezoelectric films by adhesive layers. This piezoelectric element can be bent upward or downward by distributing electricity to the electrodes and applying a voltage to the piezoelectric films.

Patent Document 1: Japanese Patent Application Laid-Open No. 59-115580

SUMMARY OF THE INVENTION

By adjusting a phase of the voltage to be applied to each piezoelectric film of the piezoelectric element disclosed in Patent Document 1, not only can the piezoelectric element be bent, but the piezoelectric element can also be stretched and contracted. However, in this case, the adhesive layers constrain the piezoelectric films, and therefore the adhesive layers inhibit stretch and contraction of the piezoelectric element. Hence, there is a concern that, even when the piezoelectric element disclosed in Patent Document 1 is stretched and contracted, it is not possible to provide a sufficient stretching and contracting force.

It is therefore an object of the present invention to provide an electric machine converting element which can provide a great stretching and contracting force from a weak drive signal, and a tactile sense presenting device which includes the electric machine converting element.

An electric machine converting element according to the present invention includes a plurality of laminated films and bonding members. The films stretch and contract in a predetermined direction parallel to principal surfaces thereof when a voltage is applied. The bonding members are formed partially between the films when seen from a plan view, are aligned at intervals in the predetermined direction of the films and bond the films to each other.

According to this configuration, the films are partially bonded to each other, so that there are portions at which the films are not constrained by each other. Consequently, stretch and contraction of the electric machine converting element are hardly inhibited, thereby making it is possible to provide a great stretching and contracting force from a weak drive signal. Further, since the films are hardly constrained by each other when the films stretch and contract, it is also possible to prevent the bonding members between the films from being peeled. Further, the bonding members do not need to be formed between all the films, so that it is possible to omit parts of the bonding process and decrease an amount of bonding members used.

Preferably, in the electric machine converting element according to the present invention, the bonding members are formed near both end portions of the films in the predetermined direction.

According to this configuration, the bonding members are formed at minimum necessary portions for bonding the films, so that the effect according to the present invention becomes more remarkable.

In the electric machine converting element according to the present invention, three or more of the bonding members may be aligned in the predetermined direction of the films.

According to this configuration, the films are bonded to each other at portions other than both the end portions of the electric machine converting element, so that it is possible to prevent the films from slackening and the films from wrinkling.

The electric machine converting element according to the present invention may further include a filler which is filled in gaps formed by the bonding members between the films.

According to this configuration, when, for example, electrodes are formed on both principal surfaces of the films in order to apply a voltage to the films, the electrodes do not rub against each other when the electric machine converting element stretches and contracts. Consequently, a friction does not occur between the electrodes, so that it is possible to prevent the electrodes from being peeled from the films and heat and sound from being generated.

Further, the filler is provided so that a difference between the thickness of the bonding portions at which the bonding members are provided and the thickness of other non-bonding portions is little when seen from the plan view. Consequently, even when the number of laminated films increases, it is possible to prevent the difference between the thicknesses of the bonding portions and the non-bonding portions from becoming greater. As a result, the films are easily laminated and a crack is hardly produced near the boundaries between the bonding portions and the non-bonding portions.

In the electric machine converting element according to the present invention, electrodes may be formed between the films.

In the electric machine converting element according to the present invention, the electrodes are formed on the principal surfaces of the films. The electrodes are not formed between the films and the bonding members.

According to this configuration, when the films stretch and contract, the bonding members do not constrain the electrodes, so that it is possible to prevent the electrodes from being peeled from the films. Consequently, it is possible to prevent that the electrodes are peeled from the films and a voltage is not appropriately applied to the films.

In the electric machine converting element according to the present invention, at least some of the bonding members overlap other consecutive bonding members in a lamination direction of the films.

When the bonding members of all layers overlap from the plan view, a difference between the thickness of the portions at which the bonding members overlap and the thickness of portions at which the bonding members do not overlap becomes great. By contrast with this, at least some of the bonding members are disposed so as to not overlap with consecutive bonding members in the laminating direction when viewed from the plan view. Consequently, it is possible to make the difference between the thicknesses moderate. Particularly when the thicknesses of the bonding members vary or when the number of laminated films is large, an effect is more remarkable.

Preferably, in the electric machine converting element according to the present invention, there is no slack in each film between the bonding members.

A tactile sense presenting device according to the present invention includes the electric machine converting element according to the present invention, a diaphragm, a touch detecting unit and a driving unit. The diaphragm is fixed to the electric machine converting element in a state where a bending stress is applied to the diaphragm. The touch detecting unit detects a touch operation. The driving unit applies a drive signal to the electric machine converting element when the touch detecting unit detects the touch operation.

According to this configuration, stretch and contraction of the electric machine converting element are hardly inhibited, so that it is possible to strongly warp the diaphragm by a weak drive signal. Consequently, when a user performs a touch operation, it is possible to make the user feel a strong sense of a key stroke without consuming high electric power.

According to the present invention, it is possible to realize an electric machine converting element which produces a great stretching and contracting force from a weak drive signal.

DETAILED DESCRIPTION OF PREFERRED EMBODIMENTS OF THE INVENTION

<<First Embodiment>>

Figure 1:
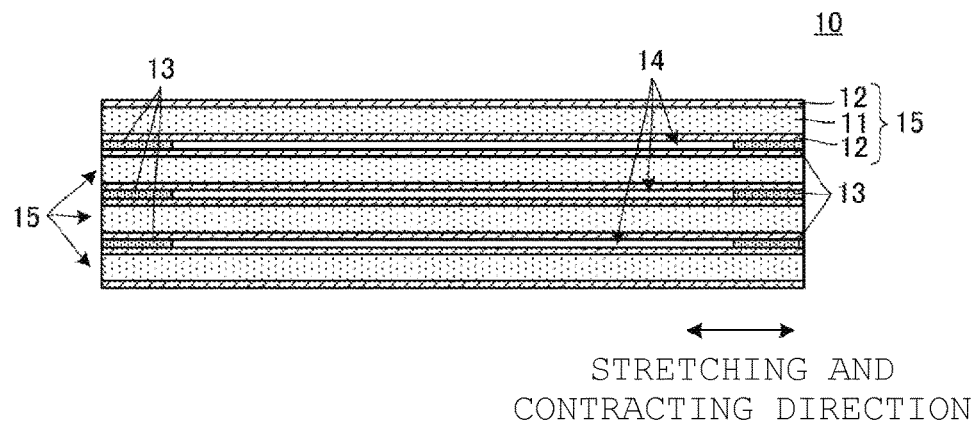
FIG. 1 is a sectional view of a piezoelectric element according to a first embodiment.

A piezoelectric element (electric machine converting element) 10 according to the first embodiment of the present invention will now be described. FIG. 1 is a sectional view of the piezoelectric element 10. The piezoelectric element 10 is formed by laminating a plurality of electrode-equipped piezoelectric films 15. Each electrode-equipped piezoelectric film 15 is formed by forming planar electrodes 12 over both the entire principal surfaces of each piezoelectric film (film) 11. For each piezoelectric films 11, a material such as polyvinylidene fluoride (PVDF) or chiral polymers is used, for example. When a voltage is applied between the planar electrodes 12 sandwiching the piezoelectric film 11, a piezoelectric effect causes the piezoelectric film 11 to stretch and contract the most greatly in a direction vertical to a laminating direction and a normal direction of a section. The direction in which the piezoelectric effect causes the piezoelectric film to stretch and contract the most greatly will be referred to as a stretching and contracting direction. The stretching and contracting direction corresponds to a "predetermined direction" according to the present invention. For each planar electrode 12, an aluminum deposited electrode having a relatively high conductivity is used in order to reduce power consumption. Further, when transparency is necessary, it is suitable to use indium tin oxide (ITO), zinc oxide (ZnO), polythiophene or silver nanowire electrodes.

Each electrode-equipped piezoelectric film 15 is adhered (bonded) to each other by adhesive layers (bonding members) 13. The adhesive layers 13 are formed between the electrode-equipped piezoelectric films 15 and near both end portions of the piezoelectric element 10 in the stretching and contracting direction. That is, the adhesive layers 13 are formed partially between the piezoelectric films 11 when seen from a plan view, and are aligned at intervals in the stretching and contracting direction. The adhesive layers 13 are formed near both the end portions of the piezoelectric films 11 in the stretching and contracting direction. In this regard, both the end portions are not limited to the very end portions of the piezoelectric films 11, and the lengths of both the end portions in the stretching and contracting direction include a range of approximately 10% of the lengths of the piezoelectric films 11 in the stretching and contracting directions. Each adhesive layer 13 is composed of an adhesive, an adhesive sheet or a pressure sensitive adhesive sheet, for example. Further, by using a thermosetting resin for each adhesive layer 13 and melting the thermosetting resin by ultrasonic vibration, the electrode-equipped piezoelectric films 15 may be adhered to each other.

Each piezoelectric film 11 has the same shape and the same size, and is laminated to be aligned when seen from the plan view. Each piezoelectric film 11 is laminated taut so that there is no slack between the adhesive layers. In this regard, the state where the films do not have slack means that an area of each laminated film when seen from the plan view is 0.9 times or more and 1 time or less an area of the principal surface of each film which is not stretched and contracted.

By optionally applying an alternating-current voltage between the planar electrodes 12 sandwiching the piezoelectric film 11, the piezoelectric element 10 can stretch and contract each piezoelectric film 11 in the stretching and contracting direction at the same phase. Consequently, it is possible to stretch and contract the piezoelectric element 10 in the stretching and contracting direction.

Figure 2A:
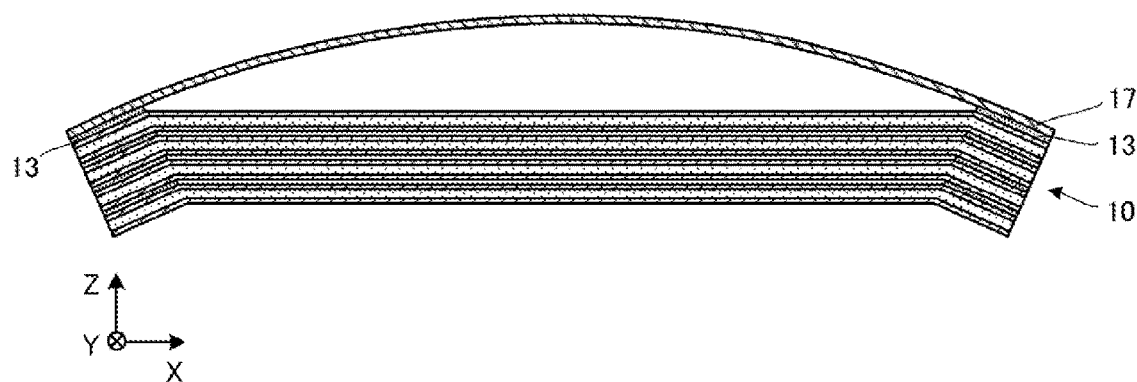
FIG. 2(A) is a sectional view of a tactile sense presenting device according to the first embodiment.

FIG. 2(A) is a sectional view of a tactile sense presenting device for which the piezoelectric element 10 is used. FIG. 2(A) illustrates the thicker laminated film layer than the thickness of a diaphragm for ease of illustration. Actually, the laminated film layer is thinner than the thickness of the diaphragm. In this regard, a direction vertical to a principal surface of the piezoelectric element 10 is a Z direction, a direction parallel to the principal surface of the piezoelectric element 10 is an X direction and a direction vertical to the Z direction and the X direction is a Y direction. The tactile sense presenting device includes the piezoelectric element 10, a diaphragm 17, a touch panel (not illustrated) and a driving unit (not illustrated). The diaphragm 17 has a thin flat shape which is, for example, longer in the X direction than in the Y direction when seen from a schematic view. The diaphragm 17 is made of acrylic resin PMMA, for example. In this regard, for the diaphragm 17, other materials such as a metal plate such as a stainless steel plate or a copper plate, PET, polycarbonate (PC), a glass epoxy resin and glass may be used.

Each end portion of the diaphragm 17 and each end portion of the piezoelectric element 10 are fixed by the adhesive layers 13. The diaphragm 17 is warped protruding toward a side opposite to a side of the piezoelectric element 10. That is, the diaphragm 17 produces a bending stress and a tensile force in the X direction is applied to the piezoelectric element 10. A hollow area is formed between the piezoelectric element 10 and the diaphragm 17. The touch panel is provided on a principal surface of the principal surfaces of the diaphragm 17 at the side opposite to the side of the piezoelectric element 10. The touch panel is provided with a touch sensor (touch detecting unit) which detects a touch operation. The planar electrodes 12 (see FIG. 1) of the piezoelectric element 10 are connected to the driving unit which drives the piezoelectric element 10.

When a user performs a touch operation on the touch sensor, the driving unit applies a drive signal to the piezoelectric element 10. The piezoelectric element 10 stretches and contracts in the X direction, and a center portion of the diaphragm 17 in the X direction vibrates in the Z direction. The vibration of the diaphragm 17 transmits to the user, so that the user feels a sense of key stroke.

Figure 2B:
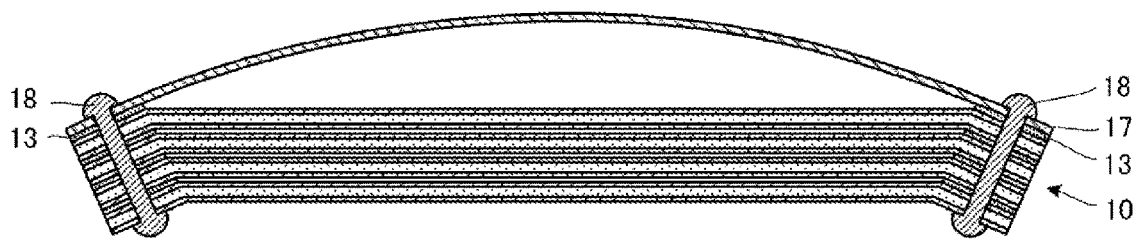
FIG. 2(B) is a sectional view of a tactile sense presenting device according to a modified example of the first embodiment.

Note that as illustrated in FIG. 2(B), each end portion of the piezoelectric element 10 and the diaphragm 17 may be fixed by the adhesive layers 13 and, in addition, penetrating members 18 which penetrate the piezoelectric element 10 and the diaphragm 17. The penetrating members 18 are, for example, screws, caulks, eyelets or rivets. Further, the piezoelectric element may have a size which covers the entire diaphragm, or piezoelectric elements of elongated shapes may be disposed separately at a plurality of positions.

In the first embodiment, the adhesive layers 13 are formed only at both the end portions of the piezoelectric element 10 in the stretching and contracting direction, so that the piezoelectric films 11 do not constrain each other. Consequently, stretch and contraction of the piezoelectric element 10 are not inhibited, so that it is possible to provide a great stretching and contracting force from a weak drive signal and improve characteristics of the piezoelectric element.

Further, part of the principal surface of each electrode-equipped piezoelectric film 15 is adhered to each adhesive layer 13. Hence, when the piezoelectric element 10 stretches and contracts, the electrode-equipped piezoelectric films 15 hardly constrain each other. Consequently, it is possible to prevent the adhesive layers between the electrode-equipped piezoelectric films 15 from being peeled. Consequently, it is also possible to prevent the adhesive layers from being locally peeled in the surroundings, thereby inhibiting stretch and contraction of the piezoelectric element 10. Further, the adhesive layers 13 do not need to be formed between all the electrode-equipped piezoelectric films 15, making it possible to omit parts of the adhering process and decrease the amount of adhesive material used.

Furthermore, in the tactile sense presenting device in which the piezoelectric element 10 is used, stretch and contraction of the piezoelectric element 10 are hardly inhibited. Consequently, it is possible to strongly warp the diaphragm 17 by a weak drive signal. Therefore, when a user performs a touch operation, it is possible to make the user feel a strong sense of a key stroke without consuming high electric power.

Figure 3:
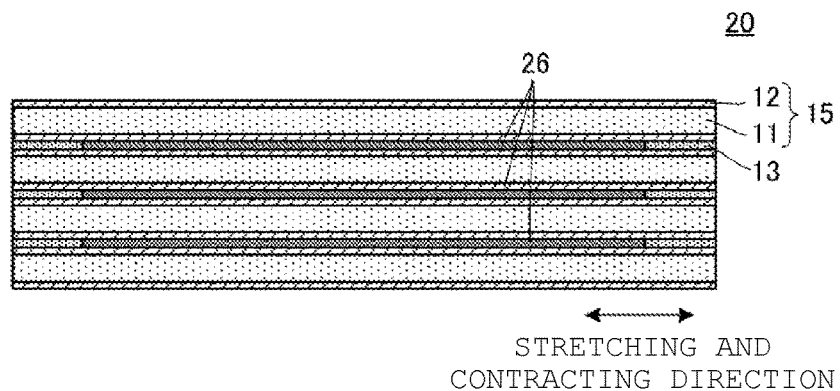
FIG. 3 is a sectional view of a piezoelectric element according to the modified example of the first embodiment.

FIG. 3 is a sectional view of a piezoelectric element 20 according to a modified example of the first embodiment. The piezoelectric element 20 is formed by providing a filler 26 in gaps 14 (see FIG. 1) of the piezoelectric element 10. That is, the filler 26 is provided at portions at which the adhesive layers 13 are not formed between the electrode-equipped piezoelectric films 15. The filler 26 is made, for example, of a material such as silicone gel which does not constrain the piezoelectric films 11 and has fluidity.

When the gaps 14 are formed between the electrode-equipped piezoelectric films 15, the planar electrodes 12 facing each other with the gaps 14 interposed therebetween rub against each other when the piezoelectric element 10 stretches and contracts, and the planar electrodes 12 are peeled from the piezoelectric films 11 or heat or sound is generated in some cases. By providing the filler 26 in the gaps 14 in the piezoelectric element 20, the planar electrodes 12 do not rub against each other, and friction is not generated between the planar electrodes 12. Consequently, it is possible to prevent the planar electrodes 12 from being peeled from the piezoelectric films 11 and heat and sound from being generated.

Further, the filler 26 is provided so that a difference between the thickness of the bonding portions at which the adhesive layers 13 are formed and the thickness of other non-bonding portions is minimized. Consequently, even when the number of laminated piezoelectric films 11 increases, it is possible to prevent the difference between the thicknesses of the bonding portions and the non-bonding portions from becoming greater. As a result, the piezoelectric films 11 are easily laminated and a crack is hardly produced near the boundaries of the bonding portions and the non-bonding portions.

<<Second Embodiment>>

Figure 4:
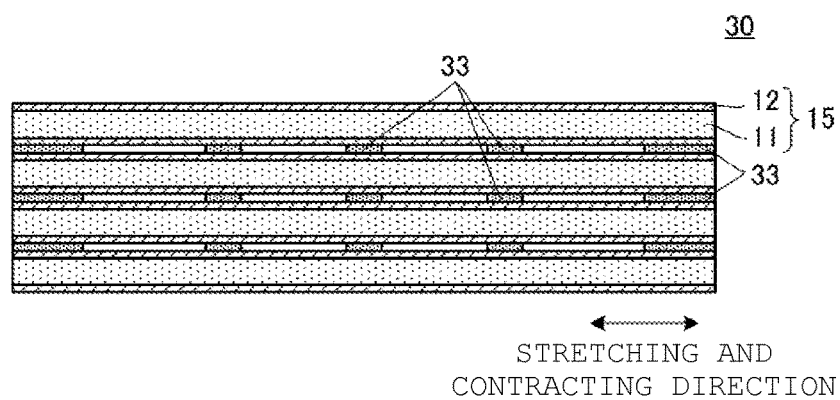
FIG. 4 is a sectional view of a piezoelectric element according to a second embodiment.

A piezoelectric element 30 according to the second embodiment of the present invention will be described. FIG. 4 is a sectional view of the piezoelectric element 30. Adhesive layers 33 are formed at both end portions of the piezoelectric element 30 in a stretching and contracting direction, and the three adhesive layers 33 are formed between these both end portions. The adhesive layers 33 are aligned at equal intervals along the stretching and contracting direction. Areas of the adhesive layers 33 formed at both the end portions of the piezoelectric element 30 when seen from a plan view are larger than areas of the adhesive layers 33 formed between these both end portions. The other components are the same as those of a piezoelectric element 10 (see FIG. 1).

In this regard, each electrode-equipped piezoelectric film 15 may be temporarily adhered by a thermal curing adhesive or a UV curing adhesive, only necessary portions of the adhesive may be cured by heating or ultraviolet rays and unnecessary portions (uncured portions) of the adhesive may be removed by cleaning in order to form the adhesive layers 33. Further, the uncured portions may not be removed and may be used as fillers.

In the second embodiment, piezoelectric films 11 are adhered to each other at portions other than both the end portions of the piezoelectric element 30, so that it is possible to prevent the piezoelectric films 11 from slackening and the piezoelectric films 11 from wrinkling.

<<Third Embodiment>>

Figure 5:
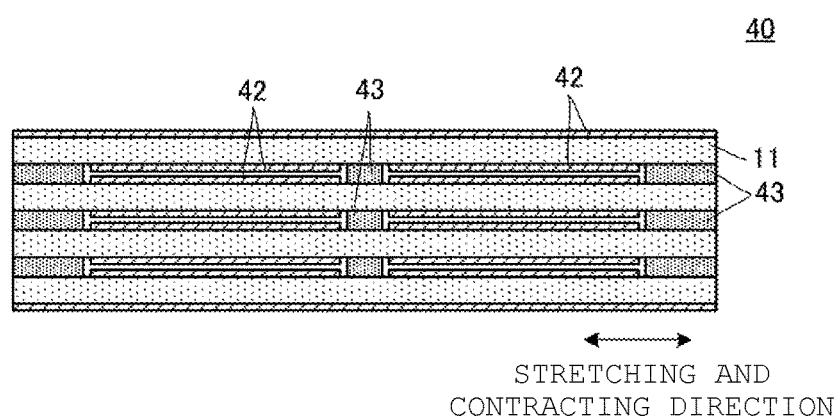
FIG. 5 is a sectional view of a piezoelectric element according to a third embodiment.

A piezoelectric element 40 according to the third embodiment of the present invention will be described. FIG. 5 is a sectional view of the piezoelectric element 40. Planar electrodes are not formed at portions of the piezoelectric element 40 at which piezoelectric films 11 are adhered to each other by adhesive layers 43. More specifically, the adhesive layers 43 are formed at both end portions and a center portion of the piezoelectric element 40 in a stretching and contracting direction. The planar electrodes are not formed between the piezoelectric films 11 and the adhesive layers 43, and the piezoelectric films 11 and the adhesive layers 43 are in contact. Planar electrodes 42 are formed at portions sandwiched between the adhesive layers 43 along the stretching and contracting direction. The planar electrodes 42 are formed over an entire upper surface and lower surface of the piezoelectric element 40. The other components are the same as those of a piezoelectric element 10 (see FIG. 1).

In the third embodiment, the planar electrodes are not formed at the portions at which the piezoelectric films 11 are adhered to each other, so that the adhesive layers 43 do not constrain the planar electrodes 42 when the piezoelectric films 11 stretch and contract. Consequently, it is possible to prevent the planar electrodes 42 from being peeled from the piezoelectric films 11 when the piezoelectric element 40 stretches and contracts. Further, even when the piezoelectric element 40 is twisted, it is possible to prevent the planar electrodes 42 from being peeled from the piezoelectric films 11 similar to a case where the piezoelectric element 40 stretches and contracts. Consequently, it is possible to prevent that the planar electrodes 42 are peeled from the piezoelectric films 11 and a voltage is not appropriately applied to the piezoelectric films 11. Further, it is possible to prevent the planar electrodes 42 from being locally peeled in the surroundings, too, and thereby inhibiting stretch and contraction of the piezoelectric element 40.

<<Fourth Embodiment>>

Figure 6:
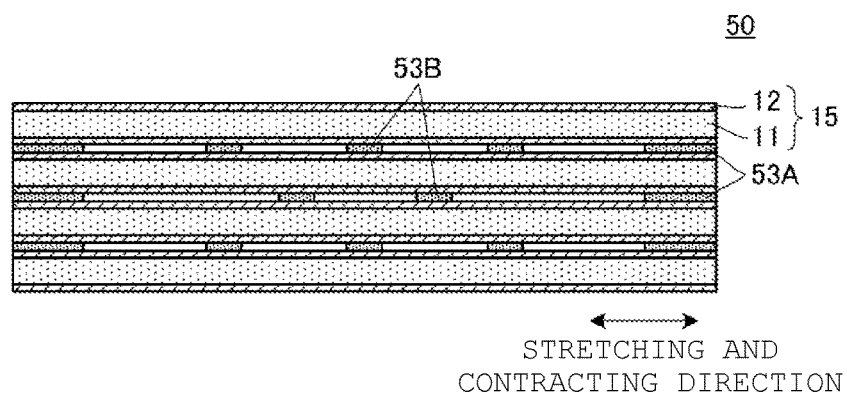
FIG. 6 is a sectional view of a piezoelectric element according to a fourth embodiment.

A piezoelectric element 50 according to the fourth embodiment of the present invention will be described. FIG. 6 is a sectional view of the piezoelectric element 50. Adhesive layers 53A are formed at both end portions of the piezoelectric element 50 in a stretching and contracting direction, and adhesive layers 53B are formed between these both end portions. The first adhesive layer 53B from the bottom does not overlap the second adhesive layer 53B from the bottom when seen from a plan view. The third adhesive layer 53B from the bottom is formed at the same position as that of the first adhesive layer 53B from the bottom when seen from the plan view. That is, at least part of the adhesive layers 53B overlap portions at which the adhesive layers 53B are not formed in an area formed by the adhesive layers 53B between piezoelectric films 11. The adhesive layers 53A and the adhesive layers 53B are not necessarily aligned at equal intervals along the stretching and contracting direction.

Intervals between electrode-equipped piezoelectric films 15 are wider at portions at which the adhesive layers are formed, and are narrower at portions at which the adhesive layers are not formed. In the fourth embodiment, the first and third adhesive layers 53B from the bottom and the second adhesive layer 53B from the bottom do not overlap when seen from the plan view. Consequently, it is possible to make the thickness of the piezoelectric element uniform compared to a case where the adhesive layers 53B in all the layers overlap when seen from the plan view. That is, the portions at which the adhesive layers 53B are formed are dispersed when seen from the plan view, so that it is possible to form the piezoelectric element in a flat shape.

In other words, in the case where the adhesive layers 53B in all the layers overlap when seen from the plan view, a difference between the thickness of the portions at which the adhesive layers 53B overlap and the thickness of the portions at which the adhesive layers 53B do not overlap becomes great. By contrast with this, by disposing at least part of the adhesive layers 53B overlapping the portions at which the adhesive layers 53B are not formed when seen from the plan view, it is possible to make the difference between the thicknesses moderate. The effect is more remarkable particularly when the thicknesses of the adhesive layers vary.

Figure 7A:
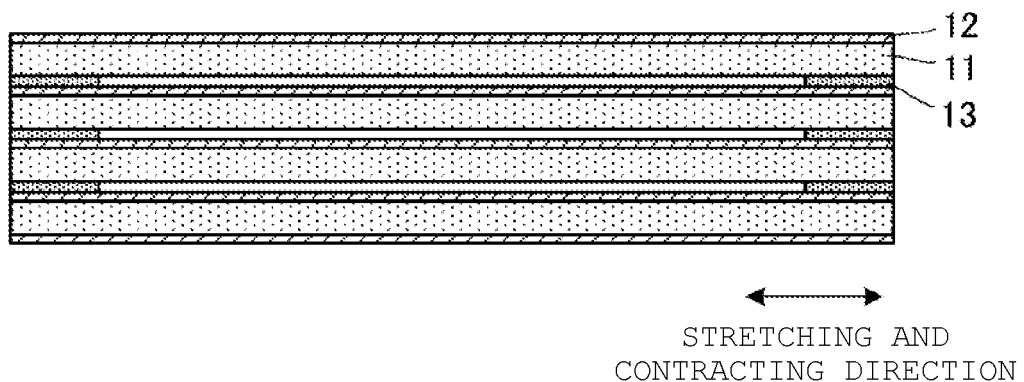
FIGS. 7(A) and 7(B) are sectional views of a piezoelectric element according to another embodiment.
Figure 7B:
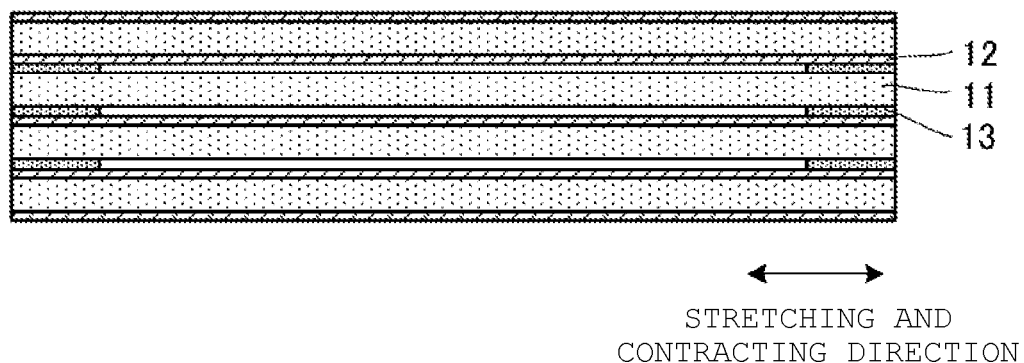

Note that in the above embodiments, planar electrodes 12 do not need to be formed on both surfaces of all the piezoelectric films 11. By providing at least one planar electrode 12 between the two neighboring piezoelectric films 11 in a laminating direction, it is possible to apply a voltage to the piezoelectric films 11. Hence, when there are the neighboring piezoelectric films 11 in the laminating direction as illustrated in FIGS. 7(A) and 7(B), if the planar electrodes 12 of one piezoelectric film 11 are formed on the opposing principal surfaces of the piezoelectric film 11, the planar electrodes 12 of the other piezoelectric film 11 do not need to be formed.

Further, the film according to the present invention is not limited to the piezoelectric films according to the above embodiments. The film according to the present invention may be an electrostrictive film, an electret film, a composite film, an electroactive polymer film and the like.

The electroactive film is a film which is electrically driven to produce a stress, or a film which is electrically driven to be deformed and cause displacement. More specifically, the electroactive film includes an electrostrictive film, a composite material (a material formed by sealing piezoelectric ceramics with resin), an electrically driving elastomer or a liquid crystal elastomer.

The film according to the present invention can also be realized by using piezoelectric films and resin films (exciter films) which does not have piezoelectricity. In this case, the piezoelectric films are pasted on principal surfaces of the exciter films, and end portions of the exciter films are connected to the diaphragm.

DESCRIPTION OF REFERENCE SYMBOLS 10, 20, 30, 40, 50: PIEZOELECTRIC ELEMENT (ELECTRIC MACHINE CONVERTING ELEMENT)
11: PIEZOELECTRIC FILM (FILM)
12, 42: PLANAR ELECTRODE
13, 33, 43, 53A, 53B: ADHESIVE LAYER (BONDING MEMBER)
14: GAP
15: ELECTRODE-EQUIPPED PIEZOELECTRIC FILM
17: DIAPHRAGM
18: PENETRATING MEMBER
26: FILLER

The invention claimed is:

1. An electric machine converting element comprising:
a plurality of laminated films configured to stretch and contract in a predetermined direction parallel to principal surfaces thereof when a voltage is applied thereto;
a plurality of bonding members positioned partially between adjacent films of the plurality of laminated films and which bond the adjacent films to each other, and when viewed from a plan view of the electric machine converting element, the plurality of bonding members are aligned at intervals in the predetermined direction of the laminated films; and
electrodes between the laminated films,
wherein the electrodes are on the principal surfaces of the films, the electrodes are not located between the laminated films and the bonding members, and a first thickness of the bonding members between adjacent films of the plurality of laminated films and which bond the adjacent films to each other is greater than a total thickness of the electrodes that are on the principal surfaces of the adjacent films that face each other and have the bonding members therebetween, wherein the plurality of laminated films are aligned such that the predetermined direction in which each of the plurality of laminated films stretch and contract a largest amount are the same, and wherein each film of the plurality of laminated films stretch and contract at the same phase when the voltage is applied thereto.

2. The electric machine converting element according to claim 1, wherein the plurality of bonding members are positioned along opposite end portions of the laminated films in the predetermined direction.

3. The electric machine converting element according to claim 2, wherein three or more of the plurality of bonding members are aligned in the predetermined direction of the laminated films.

4. The electric machine converting element according to claim 3, wherein, of the three or more bonding members, at least one bonding member does not overlap a consecutive bonding member in a laminating direction of the plurality of laminated films when viewed from the plan view.

5. The electric machine converting element according to claim 1, further comprising a filler in gaps between the bonding members and the laminated films.

6. The electric machine converting element according to claim 1, wherein the plurality of bonding members are a first plurality of bonding members, and the electric machine converting element further comprises a second plurality of bonding members in a laminating direction of the plurality of laminated films when viewed from the plan view.

7. The electric machine converting element according to claim 6, wherein each of the first plurality of bonding members is aligned with a respective one of the second plurality of bonding members in the laminating direction of the plurality of laminated films.

8. The electric machine converting element according to claim 6, wherein the first plurality of bonding members include first bonding members each positioned along opposite end portions of the laminated films in the predetermined direction, and at least one second bonding member positioned between the first bonding members; and the second plurality of bonding members include third bonding members each positioned along opposite end portions of the laminated films in the predetermined direction, and at least one fourth bonding member positioned between the third bonding members.

9. The electric machine converting element according to claim 8, wherein each of the first bonding members is aligned with a respective one of the third bonding members in the laminating direction of the plurality of laminated films, and the at least one second bonding member is not aligned with the at least one fourth bonding member in the laminating direction of the plurality of laminated films.

10. The electric machine converting element according to claim 8, wherein a first area of the first bonding members is larger than a second area of the at least one second bonding member.

11. The electric machine converting element according to claim 6, wherein first plurality of bonding members and the second plurality of bonding members are spaced at equal intervals along the predetermined direction.

12. The electric machine converting element according to claim 1, wherein each of the laminated films do not have slack between the bonding members.

13. A tactile sense presenting device comprising:
the electric machine converting element according to claim 1; and
a diaphragm fixed to the electric machine converting element in a state where a bending stress is imparted to the diaphragm.

* * * * *